US010686191B2

(12) United States Patent
Lee et al.

(10) Patent No.: US 10,686,191 B2
(45) Date of Patent: Jun. 16, 2020

(54) ELECTRODEPOSITED COPPER FOIL, AND ELECTRICAL COMPONENT AND BATTERY COMPRISING SAME

(71) Applicant: ILJIN MATERIALS CO., LTD., Iksan (KR)

(72) Inventors: Sun Hyoung Lee, Iksan (KR); Tae Jin Jo, Seongnam (KR); Seul Ki Park, Jindo (KR); Ki Deok Song, Suwon (KR)

(73) Assignee: ILJ IN MATERIALS CO., LTD., Iksan (KR)

( * ) Notice: Subject to any disclaimer, the term of this patent is extended or adjusted under 35 U.S.C. 154(b) by 532 days.

(21) Appl. No.: 15/030,447

(22) PCT Filed: Nov. 10, 2014

(86) PCT No.: PCT/KR2014/010737
§ 371 (c)(1),
(2) Date: Apr. 19, 2016

(87) PCT Pub. No.: WO2015/069075
PCT Pub. Date: May 14, 2015

(65) Prior Publication Data
US 2016/0260981 A1 Sep. 8, 2016

(30) Foreign Application Priority Data
Nov. 8, 2013 (KR) .................. 10-2013-0135227

(51) Int. Cl.
*H01M 4/66* (2006.01)
*H05K 1/09* (2006.01)
(Continued)

(52) U.S. Cl.
CPC .............. *H01M 4/661* (2013.01); *H05K 1/09* (2013.01); *H01M 10/0525* (2013.01); *H01M 2004/021* (2013.01); *H05K 2201/0355* (2013.01)

(58) Field of Classification Search
CPC .......... H01M 4/661; H01M 4/64; H01M 4/66; H01M 4/68; H01M 4/70
See application file for complete search history.

(56) References Cited

U.S. PATENT DOCUMENTS 5,833,819 A * 11/1998 Ohara ................. C25D 1/04
204/206
7,101,455 B1 * 9/2006 Hase ................. B32B 37/0015
156/247

(Continued)

FOREIGN PATENT DOCUMENTS

JP 2002-052614 A 2/2002
KR 10-0195603 B1 6/1999
(Continued)

*Primary Examiner* — James Lee
(74) *Attorney, Agent, or Firm* — Patent Office of Dr. Chung Park

(57) ABSTRACT

Disclosed is an electrodeposited copper foil, in which a center line roughness average Ra (μm), a maximum height Rmax (μm), and a ten-point height average Rz (μm) of a matte side satisfy an Equation below, $1.5 \leq (Rmax-Rz)/Ra \leq 6.5$. The electrodeposited copper foil according to the present invention maintains low roughness and high strength, and exhibits a high elongation rate, and particularly, has excellent glossiness, so that the electrodeposited copper foil may be used in a current collector of a medium and large lithigum ion secondary battery and a semiconductor packaging substrate for Tape Automated Bonding (TAB) used in a Tape Carrier Package (TCP).

8 Claims, 10 Drawing Sheets

(51) Int. Cl.
*H01M 10/0525* (2010.01)
*H01M 4/02* (2006.01)

(56) References Cited

U.S. PATENT DOCUMENTS

| | | | | |
|---|---|---|---|---|
| 2007/0111103 A1* | 5/2007 | Konishiike | ............ | H01B 1/026 |
| | | | | 429/245 |
| 2010/0038115 A1* | 2/2010 | Matsuda | .................. | C25D 1/04 |
| | | | | 174/254 |
| 2010/0136434 A1* | 6/2010 | Hanafusa | .................. | C22F 1/00 |
| | | | | 429/245 |

FOREIGN PATENT DOCUMENTS

| KR | 10-2011-0114971 A | 10/2011 |
|---|---|---|
| KR | 10-2007-0107803 A | 11/2011 |

* cited by examiner

ELECTRODEPOSITED COPPER FOIL, AND ELECTRICAL COMPONENT AND BATTERY COMPRISING SAME

CROSS-REFERENCE TO PRIOR APPLICATIONS

This application is a national Stage Patent Application of PCT International Patent Application No. PCT/KR2014/010737, filed on Nov. 10, 2014 under 35 U.S.C. § 371, which claims priority of Korean Patent Application No. 10-2013-0135227, filed on Nov. 8, 2013, which are all hereby incorporated by reference in their entirety.

TECHNICAL FIELD

The present invention relates to an electrodeposited copper foil, and an electrical component and a battery including the electrodeposited copper foil, and more particularly, to low rough, highly strong, and highly elongated electrodeposited copper foil, which has both high tensile strength and a high elongation rate even after a high-temperature heat treatment.

BACKGROUND ART

A copper foil is generally used as a current collector of a secondary battery. As the copper foil, a rolled copper foil obtained by rolling processing is mainly used, but fabricating cost of the rolled copper is high and it is difficult to fabricate a copper foil having a wide width. Further, since the rolled copper foil uses lubricating oil during the rolling processing, adhesion with an active material may be degraded by a contamination of the lubricating oil, so that a charging and discharging cycle characteristic of the battery may be degraded.

A lithium battery accompanies a change in volume during charging and discharging and a heating phenomenon according to overcharging. Further, in order to improve adhesion with an electrode active material and, in relation to expansion and contraction of an active material layer according to the charging and discharging cycle, in order to prevent wrinkle, fracture, and the like from being generated in the copper foil, which serves as a current collector, with little influence from a copper foil base material, surface roughness of the copper foil needs to be low. Accordingly, a highly elongated, highly strong, and low rough copper foil, which is capable of resisting to a change in volume and a heating phenomenon of the lithium battery and has excellent adhesion with an active material, is required.

Further, according to a demand for a light, thin, short, and small electronic device, in order to increase a degree of integration of a circuit within a small area according to high performance, compactness, and lightness, a demand for fine wiring of a semiconductor mounted substrate or a main board substrate is increased. When a thick copper foil is used for fabricating a printed wiring board having a fine pattern, an etching time for forming a wiring circuit is increased and lateral wall verticality of a wiring pattern is degraded. Particularly, when a line width of the wiring pattern formed by etching is small, the wiring may be disconnected. Accordingly, in order to obtain a fine pitch circuit, a thinner copper foil is demanded. However, a thickness of a thin copper foil is limited, so that mechanical strength of the thin copper foil is weak, so that a frequency of the generation of a failure, such as wrinkle and bending, is increased during fabricating the wiring substrate.

Further, a plurality of terminals of an Integrated Circuit (IC) chip is directly bonded to an inner lead disposed in a device hall positioned at a center portion of a product in a semiconductor packaging substrate for Tape Automated Bonding (TAB) used in a Tape Carrier Package (TCP) and the like, and in this case, a current is made to momentarily flow in the inner lead by using a bonding device to heat the inner lead and apply a predetermined pressure to the inner lead. Accordingly, the inner lead formed by etching the electrodeposited copper foil is elongated and stretched by a bonding pressure.

Accordingly, a copper foil having a small thickness, high mechanical strength, a high elongation property, and low roughness is required.

DISCLOSURE

Technical Problem

The present invention has been made in an effort to provide a new electrodeposited copper foil.

The present invention has also been made in an effort to provide an electrical component including an electrodeposited copper foil.

The present invention has also been made in an effort to provide a battery including an electrodeposited copper foil.

Technical Solution

An exemplary embodiment of the present invention provides an in which a center line roughness average Ra (μm), a maximum height Rmax (μm), and a ten-point height average Rz (μm) of a matte side satisfy an Equation below.

$$1.5 \leq (R\max - Rz)/Ra \leq 6.5.$$

Tensile strength of the electrodeposited copper foil before a heat treatment may be 40 kgf/mm$^2$ to 70 kgf/mm$^2$, and tensile strength of the electrodeposited copper foil after a heat treatment for one hour at 180° C. may be 40 kgf/mm$^2$ to 70 kgf/mm$^2$. The heat treatment may be performed for one hour at 180° C. Tensile strength of the electrodeposited copper foil after the heat treatment may be 85% to 99% of tensile strength of the electrodeposited copper foil before the heat treatment.

An elongation rate before a heat treatment may be 2% to 15%, and an elongation rate after a heat treatment may be 4% to 15%. The heat treatment may be performed for one hour at 180° C. An elongation rate after a heat treatment may be one time to 4.5 times of an elongation rate before the heat treatment.

A corner curl angle of the electrodeposited copper foil may be 0° to 45°, a corner curl height of the electrodeposited copper foil may be 0 mm to 40 mm, and the electrodeposited copper foil may have a thickness of 2 μm to 10 μm.

Another exemplary embodiment of the present invention provides a battery including the electrodeposited copper foil.

Yet another exemplary embodiment of the present invention provides an electrical component, including: an insulating base material; and the electrodeposited copper foil attached onto one surface of the insulating base material.

Advantageous Effects

According to the exemplary embodiment of the present invention, a difference between a maximum vertical distance and an average of vertical distances of surface factors protruding to the outside on a matte side is small, so that the electrodeposited copper foil of the present invention exhibits high glossiness even before a post-treatment process, thereby improving a quality of a product. Further, the electrodeposited copper foil of the present invention exhibits high strength and a high elongation rate, and stress inside the electrodeposited copper foil is small, thereby preventing a corner curling phenomenon. Accordingly, the electrodeposited copper foil of the present invention exhibits low roughness, high strength, and a high elongation rate, thereby being advantageous to perform a process and decreasing a product defective, and when the electrodeposited copper foil of the present invention is used in a product, such as a PCB or a negative electrode current collector of a secondary battery, it is possible to improve product reliability.

BEST MODE

In an electrodeposited copper foil according to an aspect of the present invention, a center line roughness average (Ra) of a matte side, a maximum height (Rmax), and a 10-point height average (Rz) satisfy the Equation below.

$$1.5 \leq (R\max - Rz)/Ra \leq 6.5$$

MODE FOR CARRYING OUT THE INVENTION

Hereinafter, an electrodeposited copper foil according to the present invention, an electrical component and a battery including the electrodeposited copper foil, and a method of fabricating the electrodeposited copper foil will be described in more detail.

An electrodeposited copper foil according to an exemplary embodiment of the present invention satisfies the Equation below.

$$1.5 \leq (R\max - Rz)/Ra \leq 6.5 \quad \text{[Equation 1]}$$

In Equation 1, Ra means a center line roughness average (μm) of a matte side, Rmax means a maximum height (μm), and Rz means a 10-point height average (μm).

Ra (roughness average) is a roughness average of a matte side, and represents a sum of an absolute value of an area between an actual surface and a center line, that is, a height of a contour of a measured section surface. Rmax means a vertical distance from a most highly protruding surface factor, that is, the highest peak, to the most deeply dug point, that is, the deepest valley. That is, Rmax means a maximum vertical distance of a surface factor. Rz is an average of values obtained by adding depths of five deepest valleys to heights of five highest peaks measured in an entire measurement section.

The "surface factor" in the present specification is a bright portion on a matte side and means a portion protruding from a surface of the electrodeposited copper foil, and a high surface factor among the surface factors is referred to as a peak, and a region dug between the surface factors is referred to as a valley.

Glossiness of the matte side of the electrodeposited copper foil according to the present invention is very high. The electrodeposited copper foil is obtained by extracting a copper foil on a surface of a negative electrode drum by supplying a current between a rotated negative electrode drum immersed in a bathtub of a copper electrolyte and a positive electrode, and a surface of the electrodeposited copper foil, which is in contact with the negative electrode drum, is referred to as a shiny side (S surface), and an opposite surface of the shiny side is referred to as a matte side. The matte side is a side on which an electrodeposited copper foil is extracted as it is unlike the shiny side which is in contact with the drum, so that the matte side originally has low glossiness and high surface roughness. Accordingly, a process of decreasing surface roughness and applying glossiness as necessary through a post-treatment is performed on the matte side.

Figure 1:
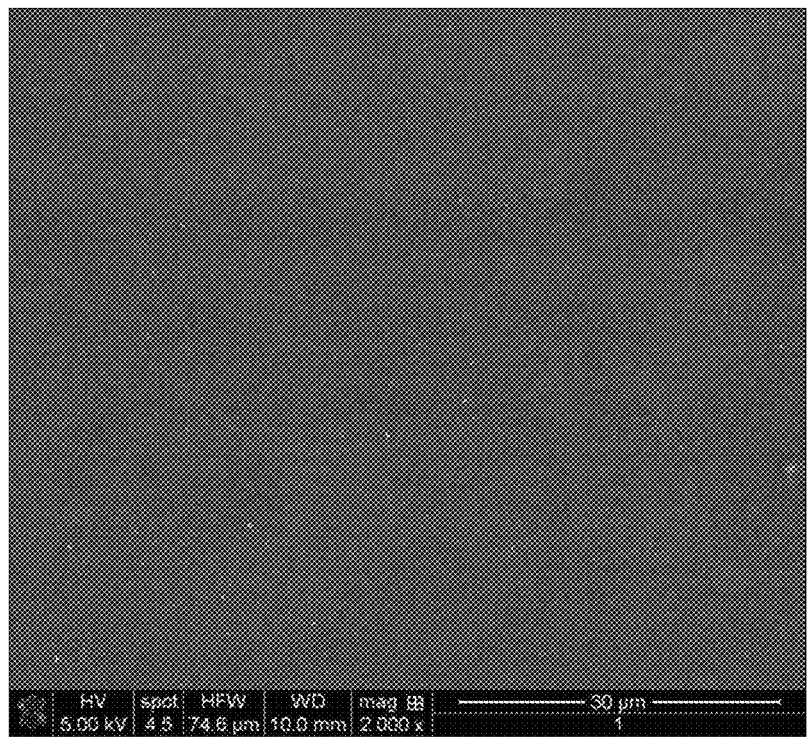
FIG. 1 is an image of a Field Emission Scanning Electron Microscopy (FESEM) of an electrodeposited copper foil magnified by 2,000 times according to an exemplary embodiment of the present disclosure.

However, a glossiness degree of the matte side of the electrodeposited copper foil according to the present invention is high even before the post-treatment processing. FIG. 1 is an image of a Field Emission Scanning Electron Microscopy (FESEM) of the electrodeposited copper foil magnified by 2,000 times according to the exemplary embodiment of the present disclosure.

When the matte side is generally 2,000 times FESEM analyzed according to a characteristic of the process, concave-convex portions are shown on the surface and glossiness is not high. By contrast, in FIG. 1, the matte side of the electrodeposited copper foil according to the present invention exhibits glossiness, such as a mirror, similar to the shiny side.

Figure 2:
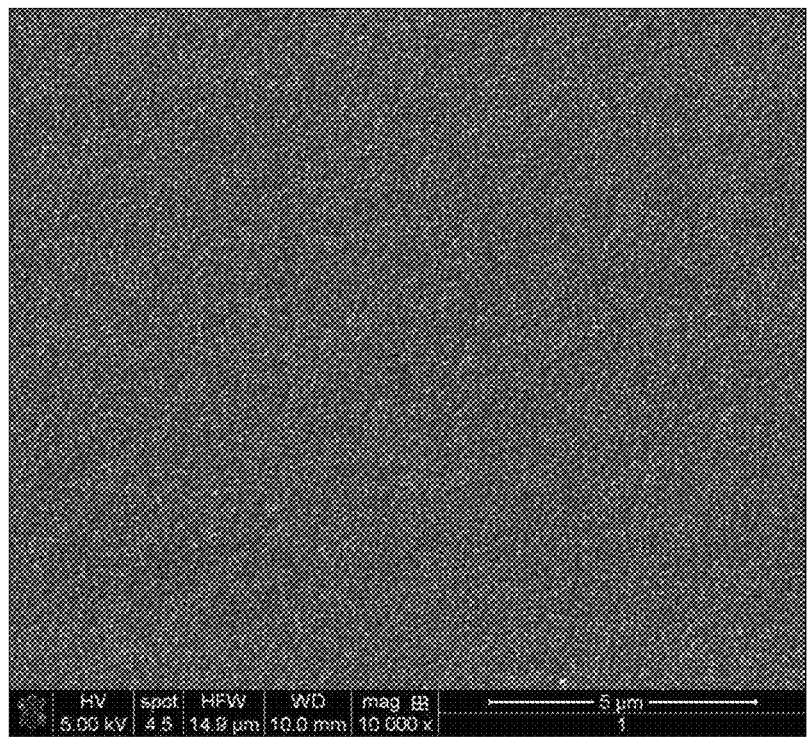
FIG. 2 is an image of an FESEM of an electrodeposited copper foil magnified by 10,000 times according to an exemplary embodiment of the present disclosure.
Figure 3:
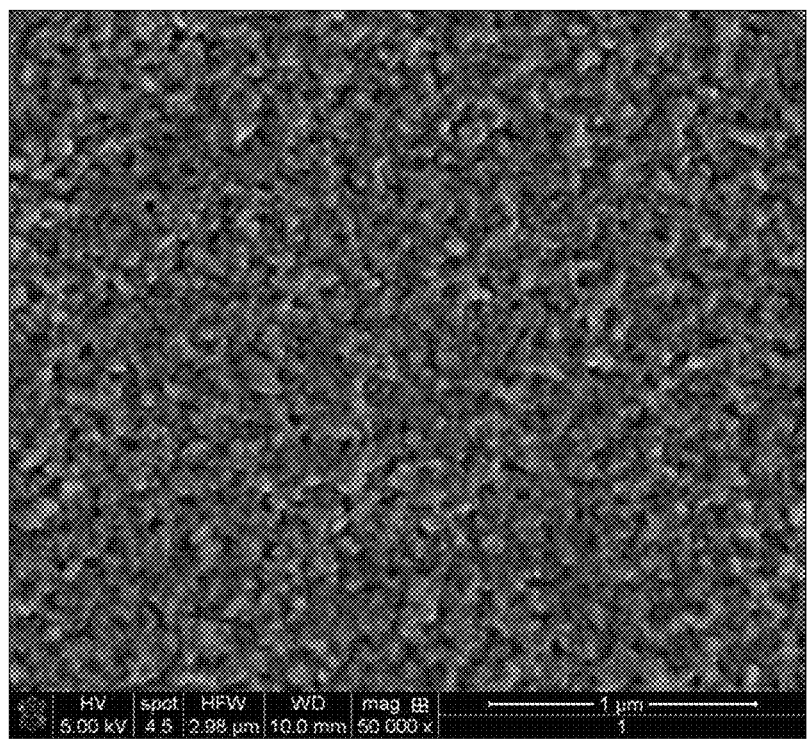
FIG. 3 is an image of an FESEM of an electrodeposited copper foil magnified by 50,000 times according to an exemplary embodiment of the present disclosure.
Figure 4:
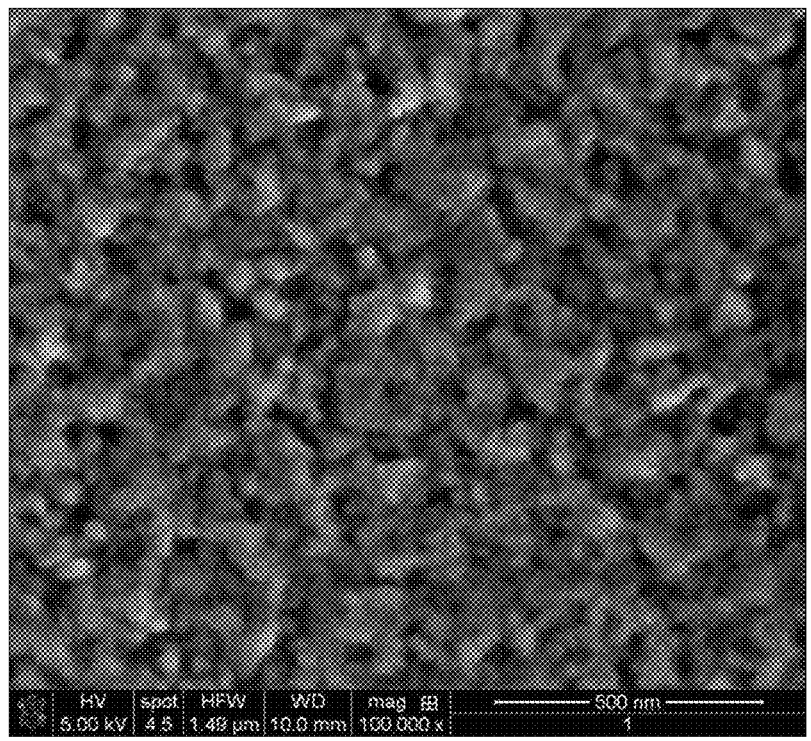
FIG. 4 is an image of an FESEM of an electrodeposited copper foil magnified by 100,000 times according to an exemplary embodiment of the present disclosure.

When a 10,000 times FESEM image of FIG. 2, a 50,000 times FESEM image of FIG. 3, and a 100,000 times FESEM image of FIG. 4 are analyzed by increasing resolution of the FESEM analysis, when the resolution is high, it is possible to confirm concave-convex portions, that is, surface factors, on the surface. However, it is difficult to confirm the concave-convex portions even in the 10,000 times FESEM image, and the concave-convex portions are confirmed at ultra-high resolution, such as the 50,000 times FESEM analysis and the 100,000 times FESEM analysis.

Figure 5:
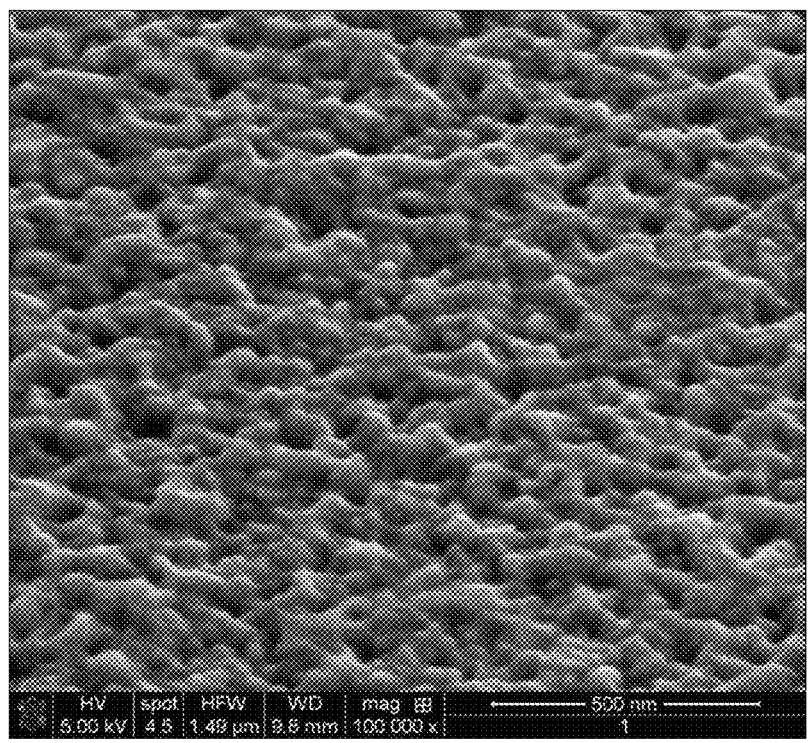
FIG. 5 is an image of an FESEM of an electrodeposited copper foil magnified by 100,000 times according to an exemplary embodiment of the present disclosure.

In FIG. 4, a size and a height of the surface factor of the matte side of the electrodeposited copper foil according to the present invention are uniform. A result of the 100,000 times FESEM analysis obtained by tilting the same sample at 52° is represented in FIG. 5. In FIG. 5, a valley between the protruding surface factors is more clearly shown.

Even when the surface of the electrodeposited copper foil has the same surface roughness, and when an area of the valley exposed to the outside is small or the number of valleys is small, surface glossiness is improved. When the roughness is determined based on a volume of the surface factors, and when a height of the peak is large at the same surface roughness, it may be considered that the peak and the valley are sharply formed. That is, when it is assumed that the surface roughness is an entire region, in which the surface factors protrude or are inserted from the surface, and when a height of the peak is large and a depth of the valley at the same surface roughness is large, it may be considered that the surface factor is sharply formed. This may means that when a height of the peak is small and a depth of the valley at the same surface roughness is small, it may be considered that the surface factor is bluntly formed.

In this case, when a depth of the valley in the matte side is small and an average diameter of a dark portion shown to the outside is large, the valley, which is the dark region represented on the surface, may further influence glossiness. That is, this means that when a depth of the valley is small and an average diameter of a dark portion is small, the dark region shown to the outside is small, so that glossiness may be improved even without an additional treatment.

Accordingly, the valley in the matte side of the electrodeposited copper foil according to the present invention having a relatively large depth and small average diameter is preferable in an aspect of glossiness. For the large depth and a small average diameter of the valley, the surface factor needs to have a large height and to be sharply formed.

To this end, the electrodeposited copper foil according to the exemplary embodiment of the present invention satisfies the Equation below.

$$1.5 \leq (Rmax - Rz)/Ra \leq 6.5 \quad \text{[Equation 1]}$$

In Equation 1, Ra means a center line roughness average (μm) of the matte side, Rmax means a maximum height (μm), and Rz means a 10-point height average (μm).

In the Equation, when a value of (Rmax−Rz)/Ra is 6.5 or less, it is possible to obtain a high glossiness value without a post-treatment process. By contrast, when a value of (Rmax−Rz)/Ra is 1.5 or less, a difference between Rmax and Rz is too small, a value from the peak to the valley of the surface factor is generally increased, so that entire surface roughness is increased.

A value obtained by subtracting Rz from Rmax is a value obtained by subtracting Rz, which is an average value of values obtained by adding heights of the five highest peaks and depths of the five deepest valleys among the surface factors, from Rmax, which is a value obtained by adding a height from a center line of the highest peak and a depth from a center line of the deepest valley among the surface factors. That is, the value obtained by subtracting Rz from Rmax means a difference between a maximum vertical length based on the center line of the surface factor and an average value of the five peaks and the five valleys including the highest peak and the deepest valley. The large difference means that a difference in height between the highest peak and the four remaining peaks is large, and this means that the surface factors are generally formed so as to have a height or depth deviation. The small difference means that the large number of high peaks and deep valleys is formed, and a height deviation of the surface factors is not large. However, Rz represents the average value of the values of the five peaks and five valleys, so that it is possible to obtain an average deviation by reflecting Ra to the Equation.

When a value of (Rmax−Rz)/Ra is large at the same surface roughness, a height deviation of the surface factors of the matte side is large, and the surface factors are bluntly formed. When a value of (Rmax−Rz)/Ra is small, a height deviation of the surface factors of the matte side is small, and the surface factors are sharply formed, thereby improving glossiness. A maximum value and a minimum value of (Rmax−Rz)/Ra will be further described below with reference to the exemplary embodiment.

In the electrodeposited copper foil according to the exemplary embodiment of the present invention, surface roughness Rz of the matte side is 1.4 μm or less, tensile strength after a heat treatment is 40 kgf/mm², and an elongation rate is 4% or more.

The electrodeposited copper foil is a low-rough copper foil having surface roughness Rz of 1.4 μm or less and has high tensile strength of 40 kgf/mm² or more, so that mechanical strength thereof is high. Further, the electrodeposited copper foil has a high elongation rate of 4% or more even after a high-temperature heat treatment.

Further, a corner curl angle of the electrodeposited copper foil according to the present invention is 0° to 45°. The corner curl angle means an angle, at which an end portion, that is, a corner or an edge, of the electrodeposited copper foil is bent when the electrodeposited copper foil is laid on a flat floor. It is known that the corner curling phenomenon of the electrodeposited copper foil is generated when internal energy of the electrodeposited copper foil is not uniform, and when the corner curling phenomenon is generated, a plurality of defects, such as a torn corner, may be generated during a process, such as deposition, in a PCB process, and in a process of the lithium secondary battery, a corner may be torn or folded, or wrinkles may be generated during a coating of an active material. When a corner curl angle of the electrodeposited copper foil is large, it is difficult to use the electrodeposited copper foil in a subsequent process, so that the corner curl angle may be 0° to 45°. Further, the electrodeposited copper foil is laid out on a flat floor and is cut in an X-shape, and a height of a rolled-up cut portion of the electrodeposited copper foil is referred to as a corner curl height, and the corner curl height may be 0 mm to 40 mm. In the case of the electrodeposited copper foil according to the present invention, impurities exist within a copper crystal, so that strength of the electrodeposited copper foil is high, and thus it is expected that a degree of corner curling is large, but impurities do not exist in a copper grain boundary, so that internal stress is decreased and thus a degree of corner curl is decreased.

Accordingly, the electrodeposited copper foil may be used for both a Printed Circuit Board (PCB)/Flexible PCB (FPC) and a current collector of a battery.

In the electrodeposited copper foil, when the surface roughness Rz of the matte side is larger than 1.4 μm, a contact surface between the surface of the electrodeposited copper foil for the negative electrode current collector and the active material is decreased, so that a life of a charging and discharging cycle and an electricity capacity at an initial stage of the charging may be decreased. Further, when the surface roughness Rz of the matte side is larger than 1.4 μm, it may not be easy to form a high-density circuit having a fine pitch on a printed wiring board.

The electrodeposited copper foil has a high strength characteristic having tensile strength of 40 kgf/mm$^2$ to 70 kgf/mm$^2$. Further, tensile strength of the electrodeposited copper foil is 40 k gf/mm$^2$ to 70 kgf/mm$^2$ even after a heat treatment. The heat treatment may be performed, for example, at 150° C. to 220° C., and more particularly, 180° C. The heat treatment may be performed for 30 minutes, one hour, two hours, and several hours. The heat treatment is performed for measuring tensile strength of the electrodeposited copper foil, and is a treatment for obtaining tensile strength or an elongation rate having a value which has a predetermined level and is not changed when the electrodeposited copper foil is stored or enters a subsequent process.

When tensile strength of the electrodeposited copper foil is less than 40 kgf/mm$^2$ after the heat treatment, mechanical strength of the electrodeposited copper foil is weak, so that it may be difficult to handle the electrodeposited copper foil.

It is preferable that the tensile strength of the electrodeposited copper foil after the heat treatment is similar to the tensile strength of the electrodeposited copper foil before the heat treatment. The tensile strength of the electrodeposited copper foil after the heat treatment may be 85% to 99% of the tensile strength of the electrodeposited copper foil before the heat treatment, and when the strength is maintained even after the heat treatment, it is easy to handle the electrodeposited copper foil in a subsequent process and a yield is increased.

An elongation rate of the electrodeposited copper foil before the heat treatment may be 2% to 15%. Further, an elongation rate of the electrodeposited copper foil after the heat treatment may be 4% to 15%, and the heat treatment may be performed for one hour at 180° C. Otherwise, the elongation rate of the electrodeposited copper foil after the heat treatment may be 1 time to 4.5 times of the elongation rate of the electrodeposited copper foil before the heat treatment.

When the elongation rate of the electrodeposited copper foil after the heat treatment is less than 4%, a crack may be generated when a subsequent process is a high-temperature process. For example, when the electrodeposited copper foil is used as the negative electrode current collector of the secondary battery, a process of fabricating the negative electrode current collector is a high-temperature process and a volume change of the active material layer is accompanied during charging/discharging, so that a crack may be generated and a defect may be caused. Accordingly, the electrodeposited copper foil needs to maintain a predetermined elongation rate after the heat treatment.

In an XRD spectrum for the matte side of the electrodeposited copper foil, it can be recognized that a ratio I(200)/I(111) of strength (I(200)) of a diffraction peak for a (200) crystalline surface to strength (I(111)) of a diffraction peak for a (111) crystalline surface is 0.5 to 1.0.

Figure 6:
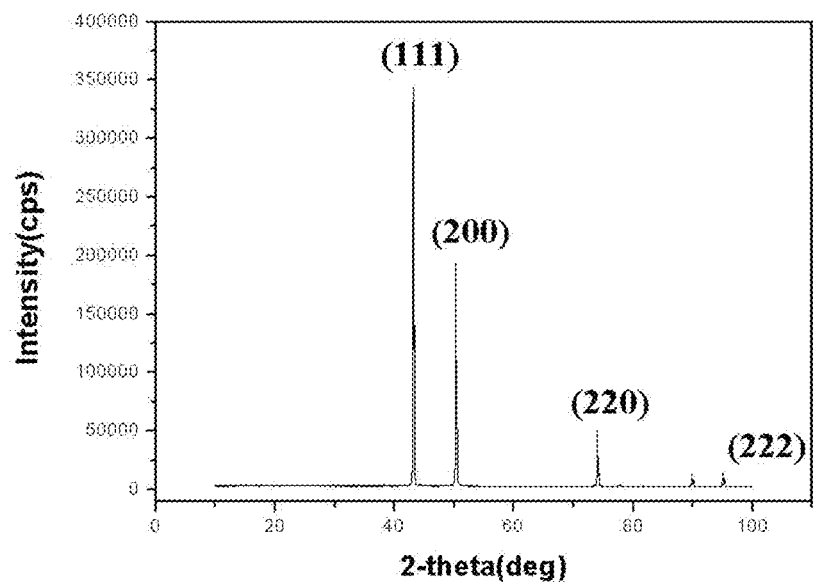
FIG. 6 is an X-ray diffraction (XRD) spectrum of a matte side of an electrodeposited copper foil fabricated in Example 1.

For example, as illustrated in FIG. 6, the XRD spectrum for the matte side represents a diffraction peak for the (111) crystalline surface at a diffraction angle (2θ) 43.0°±1.0° and a diffraction peak for the (200) crystalline surface at a diffraction angle (2θ) 50.5°±1.0°, and a strength ratio I(200)/I(111) thereof may be 0.5 to 1.5 or more.

For example, a strength ratio I(200)/I(111) of the electrodeposited copper foil may be 0.5 to 0.8. In the XRD spectrum for the matte side of the electrodeposited copper foil, M(200)/M(111) that is a ratio of an orientation index (M(200)) for the (200) crystalline surface to an orientation index (M(111)) for the (111) crystalline surface may be 1.1 to 1.5. The orientation index is a value obtained by dividing relative peak strength of a specific crystalline surface for a predetermined sample by relative peak strength of a specific crystalline surface obtained from a standard sample non-oriented to all of the crystalline surfaces. For example, a strength ratio M(200)/M(111) in the electrodeposited copper foil may be 1.2 to 1.4.

An elongation rate of the electrodeposited copper foil may be 10% or more after the heat treatment for one hour at 180° C. That is, the electrodeposited copper foil may have a high elongation rate, which is 10% or more, after a high-temperature heat treatment. For example, an elongation rate of the electrodeposited copper foil may be 10% to 20% after the high-temperature heat treatment. For example, an elongation rate of the electrodeposited copper foil may be 10% to 15% after the high-temperature heat treatment. For example, an elongation rate of the electrodeposited copper foil may be 10% to 13% after the high-temperature heat treatment. An elongation rate of the electrodeposited copper foil before the heat treatment may be 2% or more. For example, an elongation rate of the electrodeposited copper foil before the heat treatment may be 2% to 20%. For example, an elongation rate of the electrodeposited copper foil before the heat treatment may be 5% to 20%. For example, an elongation rate of the electrodeposited copper foil before the heat treatment may be 5% to 15%. For example, an elongation rate of the electrodeposited copper foil before the heat treatment may be 5% to 10%. The term "before the heat treatment" means 25° C. to 130° C. which are temperatures before a heat treatment to a high-temperature state. The elongation rate is a value obtained by dividing a distance elongated just before the electrodeposited copper foil is fractured by an initial length of the electrodeposited copper foil.

The surface roughness Rz of the matte side of the electrodeposited copper foil may be 0.7 µm or less. The electrodeposited copper foil has the surface roughness Rz of 0.7 µm or less, so that the electrodeposited copper foil may be used for both a copper foil for a PCB/FPC and a copper foil for a negative electrode current collector for a secondary battery. For example, the surface roughness Rz of the matte side of the electrodeposited copper foil may be 0.5 µm or less. For example, the surface roughness Rz of the matte side of the electrodeposited copper foil may be 0.45 µm or less.

The surface roughness Ra of the matte side of the electrodeposited copper foil may be 0.15 µm or less. The electrodeposited copper foil has the surface roughness Ra of 0.15 µm or less, so that the electrodeposited copper foil may be used for both a copper foil for a PCB/FPC and a copper foil for a negative electrode current collector for a secondary battery. For example, the surface roughness Ra of the matte side of the electrodeposited copper foil may be 0.12 µm or less. For example, the surface roughness of the matte side of the electrodeposited copper foil may be 0.11 µm or less.

The tensile strength of the electrodeposited copper foil after the heat treatment may be 85% or more of the tensile strength of the electrodeposited copper foil before the heat treatment. For example, the tensile strength of the electrodeposited copper foil after the heat treatment for one hour at 180° C. may be 90% or more of the tensile strength of the electrodeposited copper foil before the heat treatment. The tensile strength of the electrodeposited copper foil before the heat treatment is the tensile strength of the electrodeposited copper foil obtained without a high-temperature heat treatment. The tensile strength of the electrodeposited copper foil before the heat treatment may be 40 k gf/mm$^2$ to 70 kgf/mm$^2$.

Glossiness (Gs(60°)) in a width direction of the matte side of the electrodeposited copper foil may be 500 or more. For example, glossiness (Gs(60°)) in a width direction of the matte side of the electrodeposited copper foil may be 500 to 1,000. The glossiness is a value measured according to JIS Z 871-1997.

A thickness of the electrodeposited copper foil may be 35 μm or less. For example, a thickness of the electrodeposited copper foil may be 6 μm to 35 μm. For example, a thickness of the electrodeposited copper foil may be 6 μm to 18 μm. Further, for example, a thickness of the electrodeposited copper foil may be 2 μm to 10 μm.

When the electrodeposited copper foil needs to be bonded with an insulating resin and the like, a surface treatment may be additionally performed in order to obtain adhesion of a practical level or more. An example of the surface treatment on the copper foil includes any one of a heat resistant and chemically resistant treatment, a chromate treatment, and a silane coupling treatment, or a combination thereof, and the kind of surface treatment to be performed may be selected by those skilled in the art according to a resin used as an insulating resin or a process condition.

An electrical component according to an exemplary embodiment includes an insulating base material, and the electrodeposited copper foil attached onto one surface of the insulating base material, and includes a circuit formed by etching the electrodeposited copper foil.

An example of the electrical component includes a TAB tape, a PCB, and a FPC, but the electrical component is not essentially limited thereto, and any product, in which the electrodeposited copper foil is attached onto an insulating base material, and which may be used in the art, may be accepted.

A battery according to an exemplary embodiment includes the electrodeposited copper foil. The electrodeposited copper foil may be used as a negative electrode current collector of the battery, but is not essentially limited thereto, and may be used as another constituent element used in the battery. The battery is not particularly limited, and includes both a primary battery and a secondary battery, and is a battery, such as a lithium ion battery, a lithium polymer battery, and a lithium air battery, in which an electrodeposited copper foil is used as a current collector, and which may be used in the art, may be accepted.

A method of fabricating an electrodeposited copper foil according to an exemplary embodiment includes electrolyzing a copper electrolyte including an additive A, an additive B, an additive C, and an additive D, and the additive A is one or more selected from the group consisting of a thiourea-based compound and a compound, in which a thiol group is connected to a heterocycle including nitrogen, the additive B is a sulfone acid of a compound including a sulfur atom or metallic salt thereof, the additive C is a nonionic water soluble polymer, and the additive D is a *phenazinium*-based compound.

The method of fabricating the electrodeposited copper foil includes the additives of the new compositions, so that it is possible to fabricate a thin, highly mechanically strong, highly elongated, and low rough copper foil. The cooper electrolyte may include chlorine (chlorine ion) of a concentration of 1 to 40 ppm. When a small amount of chlorine ions exists in the copper electrolyte, initial nucleation sites are increased during the electroplating, so that crystal grains become fine, and the extracted materials of $CuCl_2$ formed on an interface of a grain boundary suppress the crystal from being grown during the heating at a high temperature, thereby improving thermal stability at a high temperature.

When a concentration of chlorine ions is less than 1 ppm, a concentration of chlorine ions required in a sulfuric acid-copper sulphate electrolyte is short, so that tensile strength of the electrodeposited copper foil before a heat treatment may be degraded and thermal stability at a high temperature may be degraded. When a concentration of chlorine ions is larger than 40 ppm, the surface roughness of the matte side is increased, so that it is difficult to fabricate a low rough electrodeposited copper foil, tensile strength of the electrodeposited copper foil before a heat treatment may be degraded, and thermal stability at a high temperature may be degraded.

In the cooper electrolyte, a content of additive A is 1 to 10 ppm, a content of additive B is 10 to 200 ppm, a content of additive C is 5 to 40 ppm, and a content of additive D is 1 to 10 ppm.

The additive A in the copper electrolyte may improve fabricating stability of the electrodeposited copper foil and improve strength of the electrodeposited copper foil. When the content of additive A is less than 1 ppm, tensile strength of the electrodeposited copper foil may be degraded, and when the content of additive A is larger than 10 ppm, surface roughness of the matte side is increased, so that it may be difficult to fabricate a low rough electrodeposited copper foil and tensile strength of the electrodeposited copper foil may be degraded.

The additive B in the copper electrolyte may improve surface glossiness of the electrodeposited copper foil. When the content of additive B is less than 10 ppm, glossiness of the electrodeposited copper foil may be degraded, and when the content of additive B is larger than 200 ppm, surface roughness of the matte side is increased, so that it may be difficult to fabricate a low rough electrodeposited copper foil and tensile strength of the electrodeposited copper foil may be degraded.

The additive C in the copper electrolyte may decrease surface roughness of the electrodeposited copper foil and improve surface glossiness. When the content of additive C is less than 5 ppm, surface roughness of the matte side is increased, so that it may be difficult to fabricate a low rough electrodeposited copper foil and glossiness of the electrodeposited copper foil may be degraded, and when the content of additive C is larger than 40 ppm, there is no difference in a physical property or an appearance of the electrodeposited copper foil, and the method of fabricating the electrodeposited copper foil may not be economical.

The additive D in the copper electrolyte may serve to improve flatness of a surface of the electrodeposited copper foil. When the content of additive D is less than 1 ppm, surface roughness of the matte side is increased, so that it may be difficult to fabricate a low rough electrodeposited copper foil and glossiness of the electrodeposited copper foil may be degraded, and when the content of additive D is larger than 40 ppm, an extraction state of the electrodeposited copper foil is unstable and tensile strength of the electrodeposited copper foil may be degraded.

The thiourea-based compound may be one or more selected from the group consisting of diethyl thiourea, ethylene thiourea, acetylene thiourea, diprophyl thiourea, dibutyl thiourea, N-trifluoroacetylthiourea, N-ethylthiourea, N-cyanoacetylthiourea, N-allylthiourea, o-tolylthiourea, N,N'-butylene thiourea, thiazolidinethiol, 4-thiazolinethiol, 4-methyl-2-pyrimidinethiol, and 2-thiouracil, but is not essentially limited thereto, and any kind of thiourea compound usable as an additive in the art may be accepted. The compound, in which a thiol group is connected to a heterocycle including nitrogen, may be, for example, 2-mercapto- 5-benzoimidazole sulfonic acid sodium salt, sodium 3-(5-mercapto-1-tetrazolyl)benzene sulfonate, and 2-mercapto benzothiazole.

The sulfone acid of the compound including a sulfur atom or the metallic salt thereof may be one or more selected from the group consisting of, for example, bis-(3-sulfopropyl)-disulfide disodium salt (SPS), 3-macapto-1-propane sulfonic acid (MPS), 3-(N,N-dimethyl thiocarbamoyl)-thiopropane sulfonate sodium salt (DPS), 3-[(amino-iminomethyl)thio] 1-propane sulfonate sodium salt (UPS), o-ethyldithio carbonate-S-(e-sulfopropyl)-ester sodium salt (OPX), 3-(benzothiazolyl-2-macapto)-propyl-sulfonic acid sodium salt (ZPS), Ethylenedithiodipropylsulfonic acid sodium salt, thioglycolic acid, Thiophosphoric acid-o-ethyl-bis-(ω-sulfopropyl)ester disodium salt, and Thiophosphoric acid-tris-(ω-sulfopropyl)ester trisodium salt, but is not essentially limited thereto, and any kind of sulfonic acid of a compound including a sulfur atom usable as an additive in the related art or metallic salt thereof may be acceptable.

The nonionic water soluble polymer may be one or more selected from the group consisting of polyethylene glycol, polyglycerine, hydroxyethyl cellulose, carboxymethylcellulose, Nonylphenol polyglycol ether, Octane diol-bis-(polyalkylene glycol ether, ocatanol polyalkylene glycol ether, Oleic acid polyglycol ether, polyethylene propylene glycol, polyethylene glycol dimethyl ether, polyoxypropylene glycol, polyvinyl alcohol, β-naphthol polyglycol ether, stearic acid polyglycol ester, and Stearyl alcohol polyglycol ether, but is not essentially limited thereto, and any kind of water soluble polymer usable as an additive in the related art may be acceptable. For example, molecular weight of the polyethylene glycol may be 2,000 to 20,000.

The phenazinium-based compound may be one or more selected from the group consisting of safranine-O, Janus Green B, and the like.

A temperature of the cooper electrolyte used in the fabricating method may be 30 to 60° C., but is not essentially limited to the range, and may be appropriately adjusted within a range, in which the object of the present invention may be achieved. For example, a temperature of the copper electrolyte may be 40° C. to 50° C.

A current density used in the fabricating method may be 20 to 500 A/dm$^2$, but is not essentially limited to the range, and may be appropriately adjusted within a range, in which the object of the present invention may be achieved. For example, the current density may be 30 to 40 A/dm$^2$. The copper electrolyte may be a sulfuric acid-copper sulphate electrolyte. A concentration of Cu$^{2+}$ ions in the sulfuric acid-copper sulphate electrolyte may be 60 g/L to 180 g/L, but is not essentially limited to the range, and may be appropriately adjusted within a range, in which the object of the present invention may be achieved. For example, the concentration of Cu$^{2+}$ ions may be 65 g/L to 175 g/L.

The copper electrolyte may be fabricated by a publicly known method. For example, the concentration of Cu$^{2+}$ ions may be obtained by adjusting the amount of copper ions or copper sulfonate added, and the concentration of SO$_4^{2+}$ ions may be obtained by adjusting the amount of sulfuric acid or copper sulfonate added.

A concentration of the additives included in the copper electrolyte may be obtained from the input amount and molecular weight of additives input into the copper electrolyte, or by analyzing the additives included in the copper electrolyte by a publicly known method, such as column chromatography.

The electrodeposited copper foil may be fabricated by a publicly known method except for the use of the copper electrolyte.

For example, the electrodeposited copper foil may be fabricated by supplying the copper electrolyte between a negative electrode surface on a curved surface of titanium of a rotating titanium drum and a positive electrode surface and electrolyzing the copper electrolyte, extracting the electrodeposited copper foil on the negative electrode surface, and continuously winding the extracted electrodeposited copper.

Hereinafter, the present invention will be described in detail with reference to Examples, but the present invention is not limited thereto.

Fabricate the Electrodeposited Copper Foil

EXAMPLE 1

In order to fabricate the electrodeposited copper foil by electrolysis, a 3 L electrolytic bath system which is capable of being circulated at 20 L/min was used, and a temperature of the copper electrolyte was uniformly maintained at 45° C. A dimensionally Stable Electrode (DSE) plate having a thickness of 5 mm and a size of 10×10 cm$^2$ was used as a positive electrode, and a titanium electrode plate having the same size and thickness as those of the positive electrode was used as a negative electrode.

For a smooth movement of Cu$^{2+}$ ions, plating was performed with a current density of 35 A/dm$^2$, and the electrodeposited copper foil having a thickness of 18 μm was fabricated.

A basic composition of the copper electrolyte is as follows.

CuSO$_4$·5H$_2$O: 250 to 400 g/L

H$_2$SO$_4$: 80 to 150 g/L

Chlorine ions and additives were added to the copper electrolyte, and the compositions of the added additives and chlorine ions are represented in Table 1 below. In Table 1 below, ppm means the same concentration as mg/L.

Figure 7:
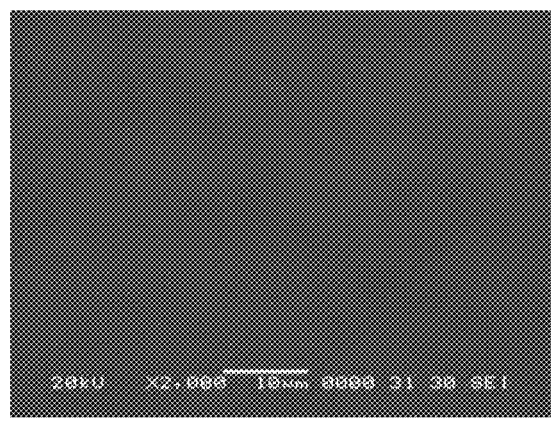
FIG. 7 is an image of a Scanning Electron Microscopy (SEM) of a surface of the electrodeposited copper foil fabricated in Example 1.
Figure 8:
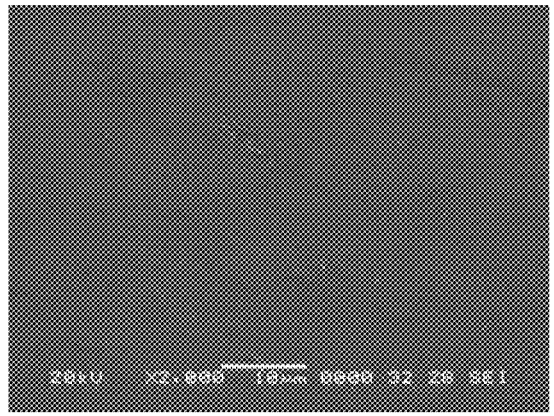
FIG. 8 is an image of an SEM for a surface of an electrodeposited copper foil fabricated in Example 2.
Figure 9:
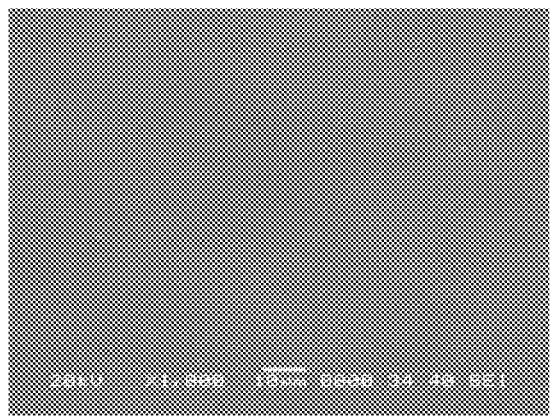
FIG. 9 is an image of an SEM for a surface of an electrodeposited copper foil fabricated in Example 3.
Figure 10:
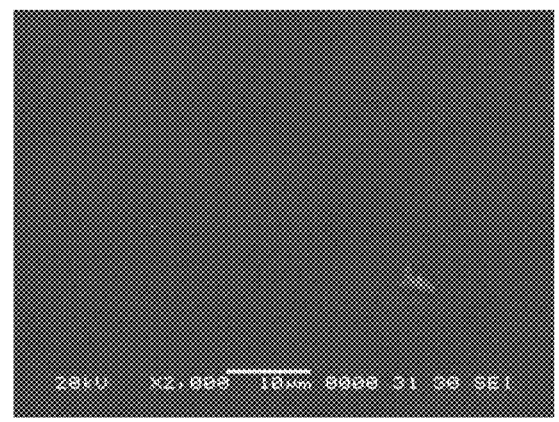
FIG. 10 is an image of an SEM for a surface of an electrodeposited copper foil fabricated in Example 4.
Figure 11:
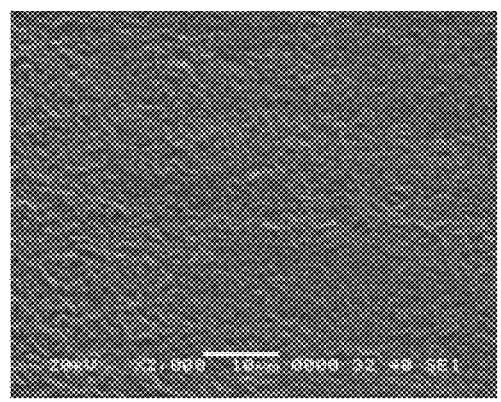
FIG. 11 is an image of an SEM for a surface of an electrodeposited copper foil fabricated in Comparative Example 1.
Figure 12:
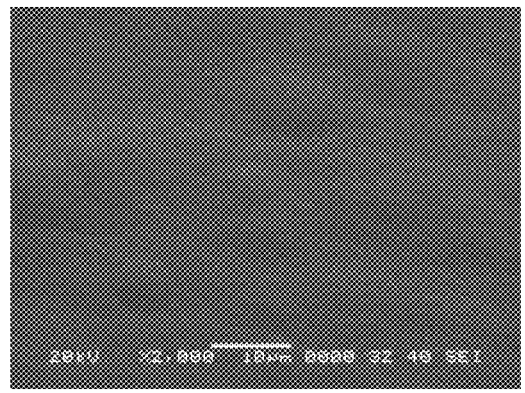
FIG. 12 is an image of an SEM for a surface of an electrodeposited copper foil fabricated in Comparative Example 2.
Figure 13:
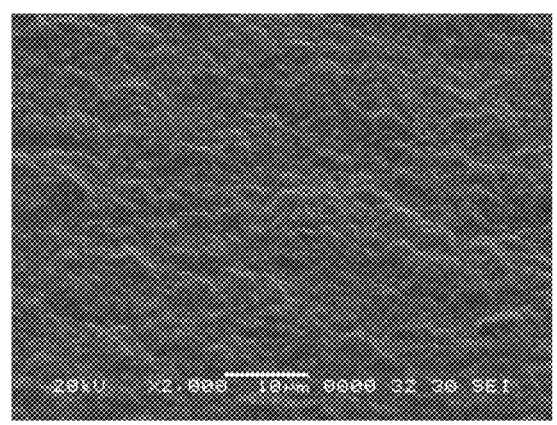
FIG. 13 is an image of an SEM for a surface of an electrodeposited copper foil fabricated in Comparative Example 3.
Figure 14:
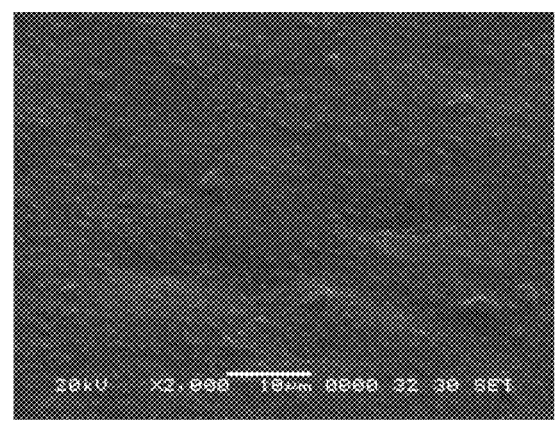
FIG. 14 is an image of an SEM for a surface of an electrodeposited copper foil fabricated in Comparative Example 4.

An SEM picture of a surface of a matte side (M side) of the fabricated electrodeposited copper foil is represented in FIG. 7.

EXAMPLES 2 TO 4 AND COMPARATIVE EXAMPLES 1 TO 4

An electrodeposited copper foil was fabricated by the same method as that of Example 1, except for the change in the composition of the copper electrolyte as represented in Table 1 below. The SEM pictures of surfaces of matte sides of the electrodeposited copper foils fabricated in Examples 2 to 4 and Comparative Examples 1 to 4 are represented in FIGS. 8 to 14, respectively.

TABLE 1

|  | Example 1 | Example 2 | Example 3 | Example 4 | Comparative Example 1 | Comparative Example 2 | Comparative Example 3 | Comparative Example 4 |
|---|---|---|---|---|---|---|---|---|
| Concentration of chlorine [ppm] | 20 | 20 | 20 | 20 | 40 | 40 | 35 | 40 |
| DET [ppm] | 3 | 2 | 3 | 3 |  |  | 1.5 | 7 |
| SPS [ppm] | 60 | 45 |  | 45 | 55 | 55 |  |  |
| MPS [ppm] |  |  | 60 |  |  |  | 5 | 20 |
| PEG [ppm] | 20 | 20 | 20 | 20 |  |  |  |  |
| ZPS [ppm] | 40 | 10 | 40 | 30 |  |  |  |  |
| JGB [ppm] |  | 3 |  |  |  |  |  |  |
| SAO [ppm] | 3 |  | 3 | 3 |  |  |  |  |
| 2M-SS [ppm] |  |  |  |  | 30 | 40 |  |  |
| DDAC [ppm] |  |  |  |  | 70 | 70 |  |  |
| PGL [ppm] |  |  |  |  |  |  | 30 | 10 |

Abbreviations in Table 1 mean compounds below.
DET: Diethyl thiourea
SPS: Bis-(3-sulfopropyl)-disulfide
MPS: 3-macapto-1-propane sulfonic acid
PEG: Polyethylene glycol (Kanto Chemical Cas No. 25322-68-3)
ZPS: 3-(benzothiazolyl-2-macapto)-propyl-sulfonic acid sodium salt
JGB: Janus Green B
2M-SS: 2-mercapto-5-benzoimidazole sulfonic acid sodium salt
DDAC: Diallyl dimethyl ammonium chloride
PGL: Polygylcerine (KCI, PGL 104 KC)

Evaluative Example 1

SEM Test

The surfaces of the matte sides of the electrodeposited copper foils obtained in Examples 1 to 4, and Comparative Examples 1 to 4 were measured with the SEM, and results of the measurement are represented in FIGS. 7 to 14, respectively.

As illustrated in FIGS. 7 to 14, the electrodeposited copper foils obtained in Examples 1 to 4 had lower surface roughness than those of the electrodeposited copper foils of Comparative Examples 1 to 4.

Evaluative Example 2

Evaluation of Glossiness

Glossiness of the surfaces of the matte sides of the electrodeposited copper foils obtained in Examples 1 to 4, and Comparative Examples 1 to 4 were measured. The glossiness is a value measured according to JIS Z 871-1997.

The glossiness was measured by radiating measurement light to the surface of the cooper foil at an incident angle of 60° according to a flow direction (an MD direction) of the electrodeposited copper foil, and measuring intensity of light reflected an a reflection angle of 60° under the glossiness measuring method JIS Z 8741-1997.

The measurement results are represented in Table 2 below.

TABLE 2

|  | Glossiness [Gs(60°)] |
|---|---|
| Example 1 | 700 |
| Example 2 | 699 |
| Example 3 | 630 |
| Example 4 | 680 |

TABLE 2-continued

|  | Glossiness [Gs(60°)] |
|---|---|
| Comparative Example 1 | 438 |
| Comparative Example 2 | 472 |
| Comparative Example 3 | 353 |
| Comparative Example 4 | 451 |

As represented in Table 2, the electrodeposited copper foil of Examples 1 to 4 exhibit improved glossiness compared to the electrodeposited copper foils of Comparative Examples 1 to 4.

Evaluative Example 3

XRD Test

XRD spectrums of the surfaces of the electrodeposited copper foils obtained in Examples 1 to 4, and Comparative Examples 1 to 4 were measured. The XRD spectrum of Example 1 is illustrated in FIG. 6.

As illustrated in FIG. 6, peak strength of the (111) crystalline surface is largest, and the peak strength of the (200) crystalline surface is the next.

A ratio I(200)/I(111) of strength (I(200)) of a diffraction peak for the (200) crystalline surface to strength (I(111)) of a diffraction peak for the (111) crystalline surface is 0.605.

Further, in the XRD spectrum for the matte side, orientation indexes M for the (111), (200), (220), (311), and (222) crystalline surfaces were measured, and the measurement results are represented in Table 3 below.

The orientation index was measured by using the orientation index M suggested by S. Yoshimura, S. Yoshihara, T. Shirakashi, E. Sato, Electrochim. Acta 39, 589(1994).

For example, in a specimen having the (111) surface, the orientation index M is calculated by a method below.

$$IFR(111)=IF(111)/\{IF(111)+IF(200)+IF(220)+IF(311)\}$$

$$IR(111)=I(111)/\{I(111)+I(200)+I(220)+I(311)\}$$

$$M(111)=IR(111)/IFR(111)$$

IF(111) is XRD strength in a JCPDS card, and I(111) is an experiment value. When M(111) is larger than 1, preferred orientation is parallel to the (111) surface, and when M(111) is smaller than 1, it means preferred orientation is decreased.

TABLE 3

| Crystalline surface | (111) | (200) | (220) | (311) | (222) |
|---|---|---|---|---|---|
| Orientation index | 1.02 | 1.34 | 0.80 | 0.25 | 0.97 |

Referring to Table 3, in the XRD spectrum for the matte side, M(200)/M(111) that is a ratio of an orientation index (M(200)) for the (200) crystalline surface to an orientation index (M(111)) for the (111) crystalline surface is 1.31.

The same electrodeposited copper foil as the electrodeposited copper foil used for measuring the tensile strength and the elongation rate at the room temperature was heat treated for one hour at 180° C. and then taken out, and tensile strength and an elongation rate of the electrodeposited copper foil were measured by the same method, and the measured tensile strength and the measured elongation rate of the electrodeposited copper foil were referred to as high-temperature tensile strength and a high-temperature elongation rate, respectively.

The room-temperature tensile strength, the room-temperature elongation rate, the high-temperature tensile strength, the high-temperature elongation rate obtained by the measurement method are represented in Table 4 below.

TABLE 4

| | Rmax [μm] | Rz [μm] | Ra [μm] | (Rmax − Rz)/Ra | Room-temperature tensile strength [kgf/mm²] | Room-temperature elongation rate [%] | High-temperature tensile strength [kgf/mm²] | High-temperature elongation rate [%] |
|---|---|---|---|---|---|---|---|---|
| Example 1 | 0.81 | 0.30 | 0.08 | 6.37 | 46.15 | 7.21 | 43.30 | 11.63 |
| Example 2 | 0.73 | 0.28 | 0.07 | 6.42 | 42.28 | 5.00 | 40.16 | 12.06 |
| Example 3 | 0.89 | 0.38 | 0.10 | 5.10 | 45.41 | 6.16 | 41.55 | 9.38 |
| Example 4 | 0.91 | 0.44 | 0.11 | 4.27 | 44.74 | 6.62 | 40.78 | 10.53 |
| Comparative Example 1 | 2.02 | 0.67 | 0.16 | 8.43 | 86.65 | 2.18 | 77.91 | 3.30 |
| Comparative Example 2 | 1.81 | 0.48 | 0.10 | 13.30 | 98.76 | 1.30 | 92.30 | 1.74 |
| Comparative Example 3 | 3.84 | 0.46 | 0.24 | 14.08 | 52.81 | 1.64 | 49.53 | 1.87 |
| Comparative Example 4 | 3.63 | 0.38 | 0.25 | 13.00 | 70.73 | 1.71 | 64.30 | 1.47 |

Evaluative Example 4

Measurement of Surface Roughness (Rz, Ra, and Rmax)

Surface roughness Rz, Ra, and Rmax of the matte sides of the electrodeposited copper foils obtained in Examples 1 to 4, and Comparative Examples 1 to 4 was measured under the standard JISB 0601-1994. The surface roughness Rz, Ra, and Rmax obtained by the measurement method is represented in Table 4 below. A small value means low roughness.

Evaluative Example 5

Measurement of Room-Temperature Tensile Strength, Room-Temperature Elongation Rate, High-Temperature Tensile Strength, and High-Temperature Elongation Rate A maximum load of the tensile strength measured by extracting tension specimens having a width of 12.7 mm×and a gauge length of 50 mm from the electrodeposited copper foils obtained in Examples 1 to 4 and Comparative Examples 1 to 4, and then performing a tension test at a crosshead speed of 50.8 mm/min under the standard IPC-TM-650 2.4.18B was referred to as room-temperature tensile strength, and an elongation rate at the fracture in this case was referred to as room-temperature elongation rate. Here, the normal temperature is 25° C.

As represented in Table 4, surface roughness Rz of the electrodeposited copper foils of Examples 1 to 4 is less than 0.5 μm, which is low, tensile strength after a high-temperature heat treatment of the electrodeposited copper foils of Examples 1 to 4 is 40 kgf/mm² or more, and most of the elongation rates of the electrodeposited copper foils of Examples 1 to 4 are 10% or more, which is high.

By contrast, the electrodeposited copper foils of Comparative Examples 1 to 4 have higher surface roughness and lower elongation rates after the high-temperature heat treatment compared to of the electrodeposited copper foils of Examples 1 to 4, so that the electrodeposited copper foils of Comparative Examples 1 to 4 are not appropriate to be used as a negative electrode current collector for a secondary battery and/or a low rough copper foil for a PDB/FPC.

Further, it is represented that values of (Rmax−Rz)/Ra of Examples 1 to 4 are 6.5 or less, which is low, but values of (Rmax−Rz)/Ra of Comparative Examples 1 to 4 are 6.5 or more, which is high. Accordingly, as can be seen in Table 2, glossiness of the electrodeposited copper foils of Examples 1 to 4 is 600 or more, so that the electrodeposited copper foils of Examples 1 to 4 exhibit high glossiness even without a post-treatment process, but the electrodeposited copper foils of Comparative Examples 1 to 4 exhibit glossiness of 500 or less.

Evaluative Example 6

Measurement of a Degree of Corner Curling

Specimens having a width 10 cm×a length 10 cm were extracted from the electrodeposited copper foils obtained in Examples 1 to 4 and Comparative Examples 1 to 4, the extracted specimens were laid on a flat floor and were cut at an angle (corner curl angle), at which corner portions were bent and in a shape of "X", and then heights (corner curl height), by which the cut portions were rolled up, were measured, and the measurement results are represented in Table 5 below.

TABLE 5

|  | Corner curl angle (°) | Corner curl height (mm) |
|---|---|---|
| Example 1 | 5 | 4 |
| Example 2 | 15 | 12 |
| Example 3 | 8 | 6 |
| Example 4 | 30 | 26 |
| Comparative Example 1 | 52 | 48 |
| Comparative Example 2 | 48 | 44 |
| Comparative Example 3 | 46 | 43 |
| Comparative Example 4 | 50 | 46 |

As represented in Table 5, the corner curl angles of the electrodeposited copper foils of Examples 1 to 4 are 5° to 30°, which are equal to or less than 45°. However, the corner curl angles of the electrodeposited copper foils of Comparative Examples 1 to 4 are 46° to 52°, which are larger than 45°, so that it is represented that the electrodeposited copper foils of Comparative Examples 1 to 4 are difficult to be treated during a subsequent process. Further, the corner curl heights of the electrodeposited copper foils of Comparative Examples 1 to 4 exceed 40 mm, so that the electrodeposited copper foils of Comparative Examples 1 to 4 exhibit poor quality states. Accordingly, the electrodeposited copper foil according to the present invention has high strength and low internal stress, thereby exhibiting a little corner curl phenomenon and excellent performance.

The present invention is not limited to the exemplary embodiments and the accompanying drawings, and shall be construed by the accompanying claims. Further, it is apparent to those skilled in the art that the present invention may be substituted, modified, and changed into various forms within the scope without departing from the technical spirit of the present invention described in the claims.

The invention claimed is:

1. An electrodeposited copper foil for a current collector of a battery, in which a center line roughness average Ra (μm), a maximum height Rmax (μm), and a ten-point height average Rz (μm) of a matte side for adjusting a height deviation and shapes of surface elements of the matte side satisfy an Equation below, $$4.27 \le (R\max - Rz)/Ra \le 6.5,$$

wherein Rz satisfies an equation: $Rz \le 1.4$ μm, and wherein a tensile strength of the electrodeposited copper foil before a heat treatment is 40 kgf/mm$^2$ to 50 kgf/mm$^2$ a room temperature.

2. The electrodeposited copper foil of claim 1, wherein an elongation rate of the electrodeposited copper foil is 6% to 15% at a room temperature.

3. The electrodeposited copper foil of claim 1, wherein a tensile strength and an elongation rate of the electrodeposited copper foil after a heat treatment for one hour at 180° C. is 40 kgf/mm$^2$ to 50 kgf/mm$^2$ and 7% to 15%, respectively.

4. The electrodeposited copper foil of claim 3, wherein the tensile strength of the electrodeposited copper foil after the heat treatment is 85% to 99% of a tensile strength of the electrodeposited copper foil before the heat treatment.

5. The electrodeposited copper foil of claim 3, wherein the elongation rate after the heat treatment is one time to 4.5 times of an elongation rate of the electrodeposited copper foil before the heat treatment.

6. The electrodeposited copper foil of claim 1, wherein a corner curl angle of the electrodeposited copper foil is 0° to 45°.

7. The electrodeposited copper foil of claim 1, wherein a corner curl height of the electrodeposited copper foil is 0 mm to 40 mm.

8. The electrodeposited copper foil of claim 1, wherein the electrodeposited copper foil has a thickness of 2 μm to 10 μm.

* * * * *